US011536604B1

(12) United States Patent
Garel et al.

(10) Patent No.: US 11,536,604 B1
(45) Date of Patent: Dec. 27, 2022

(54) LIGHT SENSOR ASSEMBLY IN A VACUUM ENVIRONMENT

(71) Applicant: EL-MUL TECHNOLOGIES LTD., Rehovot (IL)

(72) Inventors: Jonathan Garel, Rehovot (IL); Amit Weingarten, Ramat Gan (IL); Semyon Shofman, Kiryat Ekron (IL); Alexander Kadyshevitch, Tel Aviv (IL)

(73) Assignee: EL-MUL TECHNOLOGIES LTD, Rehovot (IL)

( * ) Notice: Subject to any disclaimer, the term of this patent is extended or adjusted under 35 U.S.C. 154(b) by 197 days.

(21) Appl. No.: 16/888,856

(22) Filed: Jun. 1, 2020

Related U.S. Application Data

(60) Provisional application No. 62/854,323, filed on May 30, 2019.

(51) Int. Cl.
*G01J 1/44* (2006.01)
*H01J 43/08* (2006.01)
*H01J 43/28* (2006.01)
*H01J 37/244* (2006.01)
*H01J 37/28* (2006.01)

(52) U.S. Cl.
CPC ............... *G01J 1/44* (2013.01); *H01J 37/244* (2013.01); *H01J 37/28* (2013.01); *H01J 43/08* (2013.01); *H01J 43/28* (2013.01); *G01J 2001/446* (2013.01); *H01J 2237/2443* (2013.01)

(58) Field of Classification Search
CPC ...... G01J 1/44; G01J 2001/446; H01J 37/244; H01J 37/28; H01J 43/08; H01J 43/28; H01J 2237/2443
See application file for complete search history.

(56) References Cited

U.S. PATENT DOCUMENTS 3,798,453 A * 3/1974 McIlwain ............... H01J 31/26
250/214 VT
4,350,919 A * 9/1982 Johnson ................ H01J 31/502
313/381
(Continued)

FOREIGN PATENT DOCUMENTS

WO 2006120005 11/2006

OTHER PUBLICATIONS

Abele at. al. ,"Methodology of pole piece design in permanent magnets", Journal of Applied Physics 99, 08D903 (2006).
(Continued)

*Primary Examiner* — David A Vanore (57) ABSTRACT

An in-vacuum light sensor system, including a light sensor assembly comprising a photocathode configured for converting an impinging photon to a photoelectron, a semiconductor diode configured for multiplying the photoelectron impinging thereon, and a housing including vacuum-compatible materials configured for being placed in a vacuum chamber. The housing is configured for housing the photocathode and the semiconductor diode and for propagation of the photoelectron from the photocathode to the semiconductor diode. An electrical biasing subassembly is configured for electrically biasing at least the photocathode and the semiconductor diode, and the vacuum chamber is configured for positioning the light sensor apparatus therein.

20 Claims, 5 Drawing Sheets

(56) References Cited

U.S. PATENT DOCUMENTS

| | | | |
|---|---|---|---|
| 4,359,706 A | 11/1982 | Flack | |
| 5,471,051 A * | 11/1995 | Niigaki | H01J 43/045 257/11 |
| 5,990,483 A * | 11/1999 | Shariv | H01J 49/025 250/397 |
| 7,180,060 B2 * | 2/2007 | Chefetz | H01J 49/40 250/397 |
| 7,417,235 B2 * | 8/2008 | Schon | H01J 37/28 250/208.2 |
| 7,619,231 B2 * | 11/2009 | Huang | H01S 3/0903 372/74 |
| 7,847,268 B2 * | 12/2010 | Shofman | H01J 37/244 250/397 |
| 8,222,600 B2 * | 7/2012 | Zarchin | H01J 37/244 250/397 |
| 9,673,019 B2 * | 6/2017 | Cheifetz | H01J 37/317 |
| 11,031,210 B2 * | 6/2021 | Shur | G01T 1/20 |
| 2006/0289748 A1 * | 12/2006 | Schon | H01J 43/22 250/306 |
| 2009/0140157 A1 * | 6/2009 | Meng | G01T 1/2018 250/370.11 |
| 2009/0261263 A1 * | 10/2009 | Menge | G01V 5/04 250/370.11 |
| 2009/0294687 A1 * | 12/2009 | Shofman | H01J 37/244 250/397 |
| 2010/0294931 A1 * | 11/2010 | Zarchin | H01J 37/244 250/306 |
| 2011/0095177 A1 | 4/2011 | Giannakopulos et al. | |
| 2013/0043378 A1 * | 2/2013 | Schreiber | H01L 31/024 250/238 |
| 2013/0112856 A1 * | 5/2013 | Ferenc | H01J 43/06 250/216 |
| 2014/0267641 A1 * | 9/2014 | Laine | G01C 21/025 348/61 |
| 2015/0034822 A1 * | 2/2015 | Reinhorn | H01J 37/244 250/307 |
| 2015/0262806 A1 | 9/2015 | Shimomura | |
| 2017/0069459 A1 * | 3/2017 | Cheifetz | H01J 37/244 |
| 2020/0066502 A1 * | 2/2020 | Bevis | G01T 1/2006 |

OTHER PUBLICATIONS

Teshima, "Overview PMT, HPD, Vacuum detector" ICRR, University of Tokyo, http://ndip.in2p3.fr/beaune02/sessions/teshima.pdf, 2002, 31 pages.

"Photomultipliers: Hybrid detector combines PMT and semiconductor-diode technologies", https://www.laserfocusworld.com/detectors-imaging/article/16555083/photomultipliers-hybrid-detector-combines-pmt-and-semiconductordiode-technologies, Feb. 29, 2008, 20 pages.

* cited by examiner

LIGHT SENSOR ASSEMBLY IN A VACUUM ENVIRONMENT

CROSS-REFERENCE TO RELATED APPLICATIONS

This Application claims priority benefit from U.S. Provisional Application No. 62/854,323, filed May 30, 2019 entitled: "Time of Flight Detector", the disclosure of which is incorporated herein by reference in its entirety.

TECHNICAL FIELD

This disclosure relates generally to light sensors and particularly to light sensors in vacuum environments.

BACKGROUND

Hybrid photodetectors (HPD) combines photomultiplier tube (PMT) technologies and semiconductor-photodiode technologies. HPDs contain a semiconductor device positioned within a vacuum tube housing with a photocathode window biased at high negative potential. When photons reach the photocathode, photoelectrons are emitted and accelerated towards the semiconductor device, which leads to efficient electron multiplication.

Like conventional photomultipliers, HPD scomprise a tube housing with a photocathode that reacts to light; electron multiplication elements that multiply electrons; and an output terminal that outputs an electrical signal. Yet, whereas PMTs use multiple dynodes as electron multipliers, the HPD uses a semiconductor diode instead.

SUMMARY

According to one embodiment of the present disclosure there is provided a light sensor apparatus comprising a photocathode configured for converting an impinging photon to a photoelectron, an acceleration tube for propagation of the photoelectron therethrough and a semiconductor diode configured for multiplying the photoelectron impinging thereon. The photocathode and the semiconductor diode are housed within a vacuum-compatible housing formed of vacuum-compatible materials.

The light sensor apparatus may be formed similar to the conventional HPD device such that it comprises a housing, photocathode and a semiconductor diode. In a conventional HPD device, the internal portion of the housing is vacuum sealed. Yet, the HPD housing is formed with non-vacuum compatible materials subjected to outgassing, thereby dissipating vacuum-contaminating gasses or other particles from the housing materials and rendering the HPD device unfit to be placed and operable within a vacuum environment.

In contrast, the light sensor apparatus of the present disclosure is formed with vacuum-compatible materials facilitating the positioning and operation of the light sensor apparatus within an evacuated environment of a vacuum chamber.

There is provided in accordance with an embodiment of the present disclosure an in-vacuum light sensor system, including a light sensor assembly comprising a photocathode configured for converting an impinging photon to a photoelectron, a semiconductor diode configured for multiplying the photoelectron impinging thereon, and a housing including vacuum-compatible materials configured for being placed in a vacuum chamber. The housing is configured for housing the photocathode and the semiconductor diode and for propagation of the photoelectron from the photocathode to the semiconductor diode. An electrical biasing subassembly is configured for electrically biasing at least the photocathode and the semiconductor diode, and the vacuum chamber is configured for positioning the light sensor apparatus therein.

In some embodiments, the housing consists of the vacuum-compatible materials. In some embodiments, the housing includes a tube and a cover, which are formed of the vacuum-compatible materials. In some embodiments, the vacuum chamber is provided with a vacuum feedthrough for electrical communication of the light sensor assembly with components exterior to the vacuum chamber.

In some embodiments, the housing is configured with a small diameter of less than two centimeters allowing the light sensor assembly to be positioned within a crowded vacuum chamber. In some embodiments, a diameter of the housing is about 80% or less than the diameter of a conventional hybrid photodetector (HPD) housing which includes non vacuum-compatible materials.

In some embodiments, the photocathode is in electrical communication with a high voltage supply and the semiconductor diode is in electrical communication with a low voltage supply. In some embodiments, the housing is at least partially covered by an electrically insulating material and by an electrically conducting material.

In some embodiments, the light sensor system is provided in a particle detection system, the particle detection system further includes an optional conversion system for converting a particle to an electron, a scintillator configured for converting the electrons impinging thereon to photons, and a light guide for guiding the photons exiting the scintillator to the light sensor assembly.

In some embodiments, the scintillator and the light guide are placed within the vacuum chamber. In some embodiments, the particle is an ion and the particle detection system is deployed within a time of flight (TOF) detection system. In some embodiments, the TOF detection system includes a magnetic time of flight (MTOF) detector system, which further includes an electrically biased front plate and converter plate for generating an electrical field E, and a magnetic assembly for generating a magnetic field B, thereby producing an EXB field. In some embodiments, the magnetic assembly is positioned within the vacuum chamber.

In some embodiments, the particle detection system is deployed within a scanning electron microscope (SEM) system, the SEM system including a particle beam generated by a particle beam column, the particle beam column configured to irradiate a specimen causing a particle to emit from the specimen and wherein the particle propagates to the scintillator. In some embodiments, the particle beam column is positioned within the vacuum chamber.

There is provided in accordance with an embodiment of the present disclosure a light sensor assembly including a photocathode configured for converting an impinging photon to a photoelectron, a semiconductor diode configured for multiplying the photoelectron impinging thereon, and a housing including vacuum-compatible materials configured for being placed in a vacuum chamber. The housing is configured for housing the photocathode and the semiconductor diode and for propagation of the photoelectron from the photocathode to the semiconductor diode.

In some embodiments, an output signal is generated from the photoelectron multiplied by the semiconductor diode, wherein the output signal is provided in a time response of one nanosecond or less.

There is provided in accordance with an embodiment of the present disclosure a method for generating an output signal indicative of a light signal in a vacuum chamber including converting a photon impinging on a photocathode to a photoelectron, accelerating the photoelectron within a housing to a semiconductor diode configured for multiplying the photoelectron impinging thereon, positioning the housing within a vacuum chamber, the housing including vacuum-compatible materials and being configured for housing the photocathode and the semiconductor diode, and generating an output signal from the multiplied photoelectron.

In some embodiments, the method further includes electrically biasing at least the photocathode and the semiconductor diode so as to accelerate the photoelectron from the photocathode to the semiconductor diode. In some embodiments, the output signal is provided in a time response of one nanosecond or less.

DETAILED DESCRIPTION OF EMBODIMENTS

In the following description, various aspects of the present disclosure will be described. For purposes of explanation, specific configurations and details are set forth in order to provide a thorough understanding of the present disclosure. However, it will also be apparent to one skilled in the art that the present disclosure may be practiced without the specific details presented herein. Furthermore, well known features may be omitted or simplified in order not to obscure the present disclosure.

Figure 1A:
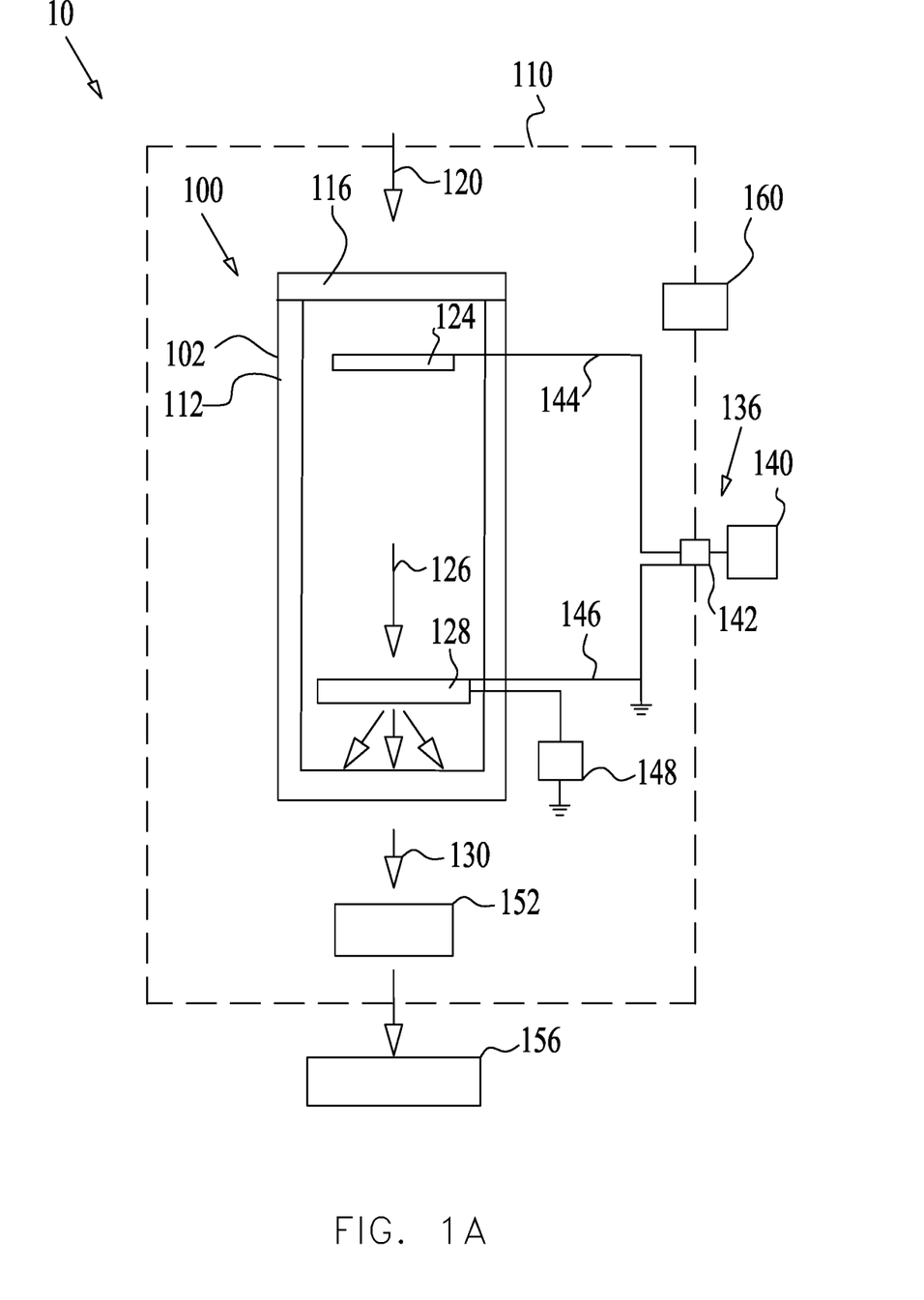
FIGS. 1A and 1B are each a simplified schematic illustration of a light sensor assembly (1A) and an exemplary simplified realization of the light sensor assembly (1B), constructed and operative according to an embodiment of the present disclosure.

As seen in FIG. 1A, an in-vacuum light sensor system 10 comprises a light sensor assembly 100. The light sensor assembly 100 comprises a housing 102 formed of any suitable vacuum-compatible material for allowing the vacuum-compatible housing 102 to be placed and operative within a vacuum chamber 110.

In a non-limiting example, the vacuum-compatible material may comprise a material which does not dissipate gas to a degree which may contaminate the vacuum chamber 110 by rendering the vacuum chamber 110 contaminated or having a low vacuum degree. In some embodiments, the vacuum-compatible material may comprise a material which is not subjected to outgassing. In a non-limiting example, the vacuum chamber 110 is vacuum sealed to a degree of less than about $10^{-5}$ Torr. In a non-limiting example, the vacuum chamber 110 is vacuum sealed to a degree of less than about $10^{-6}$ Torr. In a non-limiting example, the vacuum chamber 110 is vacuum sealed to a degree of less than about $10^{-7}$ Torr.

The housing 102, may be evacuated to form a vacuum therein. The housing 102 may comprise a receptacle portion 112 which may be shaped in any suitable shape, such as a cylindrical shape or tube, as shown in FIG. 1A. The receptacle portion 112 may be formed of any suitable vacuum-compatible material, such as a metal, e.g. stainless steel or aluminum, in a non-limiting example, or ceramics, or a combination of metal and ceramic materials. In some embodiments, the vacuum-compatible material may comprise electrically conductive materials, e.g. stainless steel or aluminum, or electrically insulating materials or a combination of electrically conductive materials and electrically insulating materials.

The housing 102 may further comprise a cover portion 116 which may be formed of any suitable vacuum-compatible material. In an embodiment, the cover portion 116 may comprise a vacuum-compatible material which is light transparent as well, such as glass, in a non-limiting example, to allow a photon 120 to enter the light sensor assembly 100 therethrough.

In some embodiments, the receptacle portion 112 and cover portion 116 are coupled together and form a monolith housing 102. In some embodiments, the receptacle portion 112 and cover portion 116 are separable.

The photons 120 passing through the cover portion 116 may impinge upon a photocathode 124, configured for converting part of the photons 120 to photoelectrons 126, typically, but not limiting, with a quantum efficiency of 0.2 to 0.4. The photoelectron 126 is accelerated through the receptacle portion 112, which is configured as an acceleration tube, for propagation of the photoelectron 126 to a semiconductor diode 128. The semiconductor diode 128 is configured for multiplying the photoelectrons 126 impinging thereon, by generating electron-hole pairs, typically with a multiplication factor (i.e. a gain) of about 1500 (but not limiting). In some embodiments, wherein the semiconductor diode 128 comprise an avalanche photodiode (APD) the signal is further multiplied by a factor typically about 50-100 (but not limiting).

In some embodiments, the semiconductor diode 128 may comprise the APD or any other semiconductor device of any other diode operative to multiply the photoelectrons 126 impinging thereon. Utilizing a semiconductor device in the light sensor assembly 100 provides for rapidly yielding an output signal 130 exiting the light sensor assembly 100. Thus, the light sensor assembly 100 provides a fast output signal, namely a fast time response for fast light sensing, which may be measured by any suitable criterion, such as by the full width at half maximum (FWHM) of a pulse width of a single photoelectron. The time response may be less than about one nanosecond, in a non-limiting example, or less than about 0.8 nanosecond, in a non-limiting example, or less than about 0.6 nanosecond, in a non-limiting example, or less than about 0.5 nanosecond, in a non-limiting example. In some embodiments, in place of the semiconductor diode 128 or in addition thereto, other types of diodes may be used. In some embodiments, in place of the semiconductor diode 128 or in addition thereto, other types of semiconductor devices may be used.

The propulsion of the photon 120 to the photocathode 124 and thereafter the propulsion of the photoelectrons 126 towards the semiconductor diode 128 may be facilitated in any suitable manner. In some embodiments, an electrical biasing subassembly 136 is configured for electrically biasing at least the photocathode 124 and the semiconductor diode 128.

In some embodiments, the electrical biasing subassembly 136 may be positioned within the vacuum chamber 110 including all the electrical biasing subassembly 136 components. In some embodiments, some components of the electrical biasing subassembly 136 may be positioned within the vacuum chamber 110 and some components may be positioned out of the vacuum chamber 110.

As seen in FIG. 1A, a component may comprise a single or a plurality of power supplies 140. The power supply 140 is shown placed externally to the vacuum chamber 110, it being appreciated that the power supply 140 may be placed within the vacuum chamber 110. In a non-limiting example, the power supply 140 may be a tunable positive power supply or a switchable high voltage power supply coupled to an electrical biasing feedthrough 142. The electrical biasing feedthrough 142 may be in electrical communication with the photocathode 124 and the semiconductor diode 128, via respective electrical wires 144 and 146 or by any other suitable means (e.g. wirelessly), so as to electrically bias the photocathode 124 and the semiconductor diode 128.

In some embodiments, an additional power supply 148 may provide a low voltage supply to the diode 128.

Figure 2:
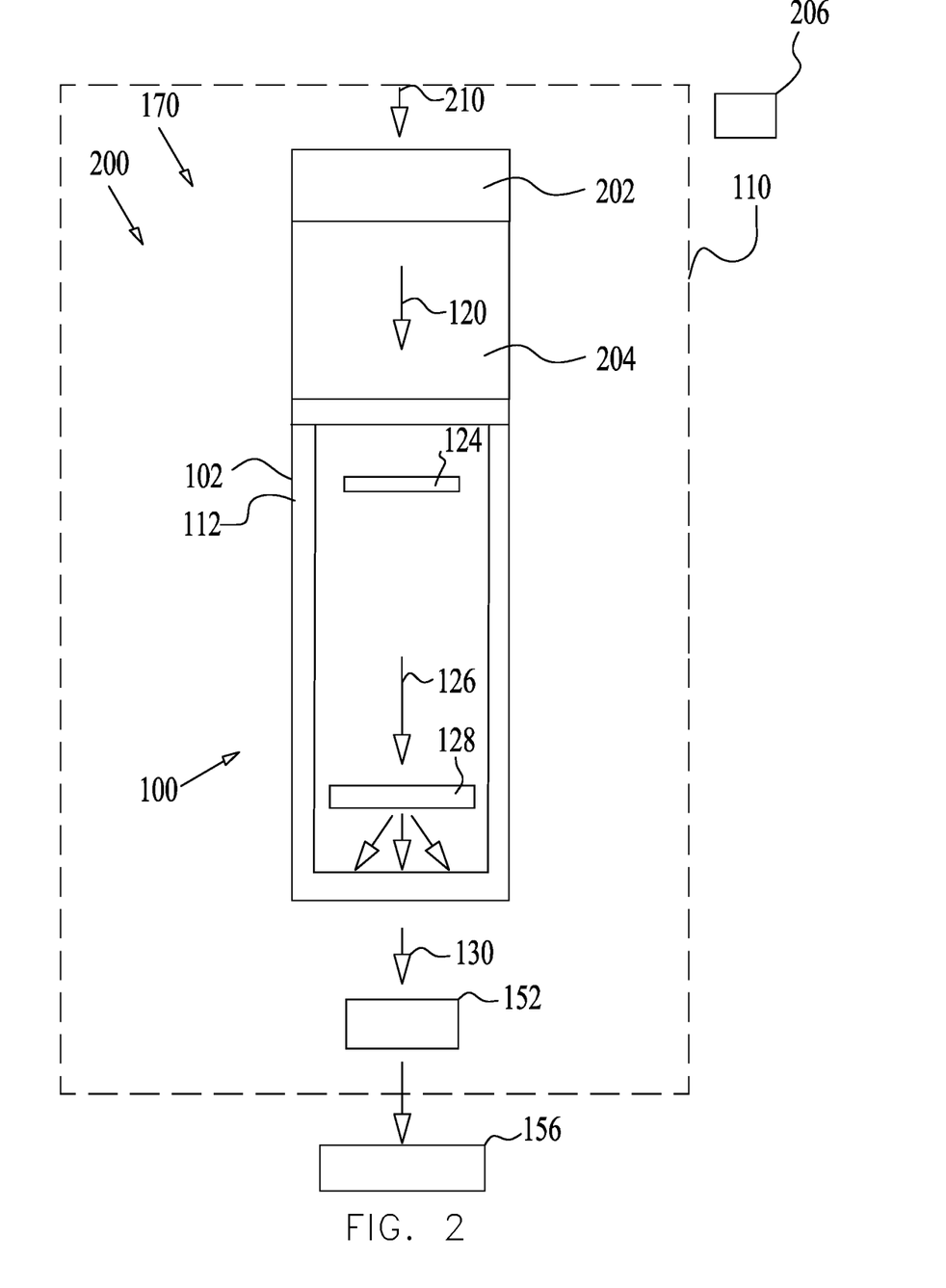
FIG. 2 is a simplified illustration of a particle detection system, constructed and operative according to an embodiment of the present disclosure.

In some embodiments, the electrical biasing feedthrough 142 may be a dedicated feedthrough. In some embodiments, the electrical biasing feedthrough 142 may utilize an existing vacuum feedthrough of a vacuum containing system 170 (FIG. 2).

In a non-limiting example, the photocathode 124 may be negatively biased to a high voltage, such as to −8 kV. In some embodiments, the voltage may be set to a voltage in the range of about −3 kV to −15 kV, subranges and variables thereof. In a non-limiting example, the semiconductor diode 128 may be positively biased to a low voltage, such as in a range of about 400V to 450V, or in a non-limiting example, to a voltage in the range of about 50V to 500V, subranges and variables thereof. In some embodiments, the photocathode 124 and/or the semiconductor diode 128 may be electrically grounded. In some embodiments, a voltage divider 190 (FIG. 1B) may be provided for dividing the voltage supplied by the power supply 140 to the photocathode 124 and the semiconductor diode 128.

In some embodiments, a signal amplifier 152 for amplifying the output signal 130 may be provided and positioned in the vacuum chamber 110, or external to the vacuum chamber 110 or partially in the vacuum chamber and partially external to the vacuum chamber 110.

In some embodiments, an analyzer or a signal processor 156 may be provided for further analyses and processing of the output signal 130. The analyzer or signal processor 156 may be positioned in the vacuum chamber 110, or external to the vacuum chamber 110 or partially in the vacuum chamber and partially external to the vacuum chamber 110.

The vacuum chamber 110 may be formed with a vacuum feedthrough 160 for facilitating communication (e.g. electrical) between the environment within the vacuum chamber 110 and external thereto. In some embodiments, the vacuum feedthrough 160 may house the electrical biasing feedthrough 142. In some embodiments, as shown in FIG. 1A, the vacuum feedthrough 160 may be separated from the electrical biasing feedthrough 142.

In some embodiments, the light sensor assembly 100 may be configured to be HPD-like, namely comprise a housing, and the photocathode 124 and the semiconductor diode 128. The conventional HPD device is formed of non-vacuum compatible materials, such as materials subjected to outgassing, e.g. rubbers, silica, adhesives and such. This prohibits the conventional HPD device from being positioned within a vacuum chamber for fear the conventional HPD device will contaminate the vacuum environment. Yet, unlike the convectional HPD device, the light sensor assembly 100 is configured to be vacuum-compatible by being formed with vacuum-compatible materials, so as to allow it to be positioned and operable within the vacuum environment of the vacuum chamber 110. The vacuum-compatible light sensor assembly of the present disclosure allows it to be operable within systems which operate within vacuum. In a non-limiting example, such vacuum containing systems 170 (FIGS. 2-4) comprise time of flight detector systems (TOF in FIG. 3) or scanning electron microscopes (SEM in FIG. 4).

In accordance with an embodiment of the present disclosure, such vacuum-containing systems 170 can deploy the vacuum-compatible light sensor assembly 100 while benefiting from the advantages of the light sensing assembly 100, which is configured with superior properties, such as fast light sensing capabilities, as described herein.

In some embodiments, the vacuum-compatible housing 102 is formed of vacuum-compatible materials resulting in a diameter 174 (FIG. 1B) significantly smaller than the diameter of the conventional non-vacuum compatible housing of a conventional HPD device. The non-vacuum compatible materials are thicker and therefore add bulk to the housing diameter. In a non limiting example, the diameter of the vacuum-compatible housing 102 is about 80% or less than the diameter of the conventional HPD housing, subranges and variables thereof. In a non limiting example, the diameter of the vacuum-compatible housing 102 is about 60% or less than the diameter of the conventional HPD housing, subranges and variables thereof. In a non limiting example, the diameter of the vacuum-compatible housing 102 is about 50% or less than the diameter of the conventional HPD housing, subranges and variables thereof. In a non limiting example, the diameter of the vacuum-compatible housing 102 is about 1.5-2 centimeters, while the diameter of the conventional HPD housing is about 4-5 centimeters. A reduced diameter of the housing 102 in particular, and a smaller light sensor assembly 100 in general, is advantageous such as in light detection systems (e.g. FIG. 2) which typically suffer from crowded vacuum chambers. These vacuum chambers may contain many elements, such as electrical components, particles and radiation detectors, sensors, particles and gas emitters and the like. Reducing the size of the light sensor assembly 100 allows it to be introduced into various types of vacuum containing systems 170 and for its safe and convenient positioning within such a system.

In some embodiments, the light sensor assembly 100 may be formed initially only with vacuum compatible materials. Alternatively, in some embodiments, the light sensor assembly 100 may be retrofitted from a conventional HPD device by removal of the non-vacuum compatible materials therefrom, such as the non-vacuum compatible materials surrounding the housing, such as for example, a rubber and/or silicon and adhesives, typically enclosing the housing. In some embodiments, the electrical biasing subassembly 136 may be added along with its wires, contacts and/or connectors, which may be also vacuum compatible and made of vacuum compatible materials.

Figure 1B:
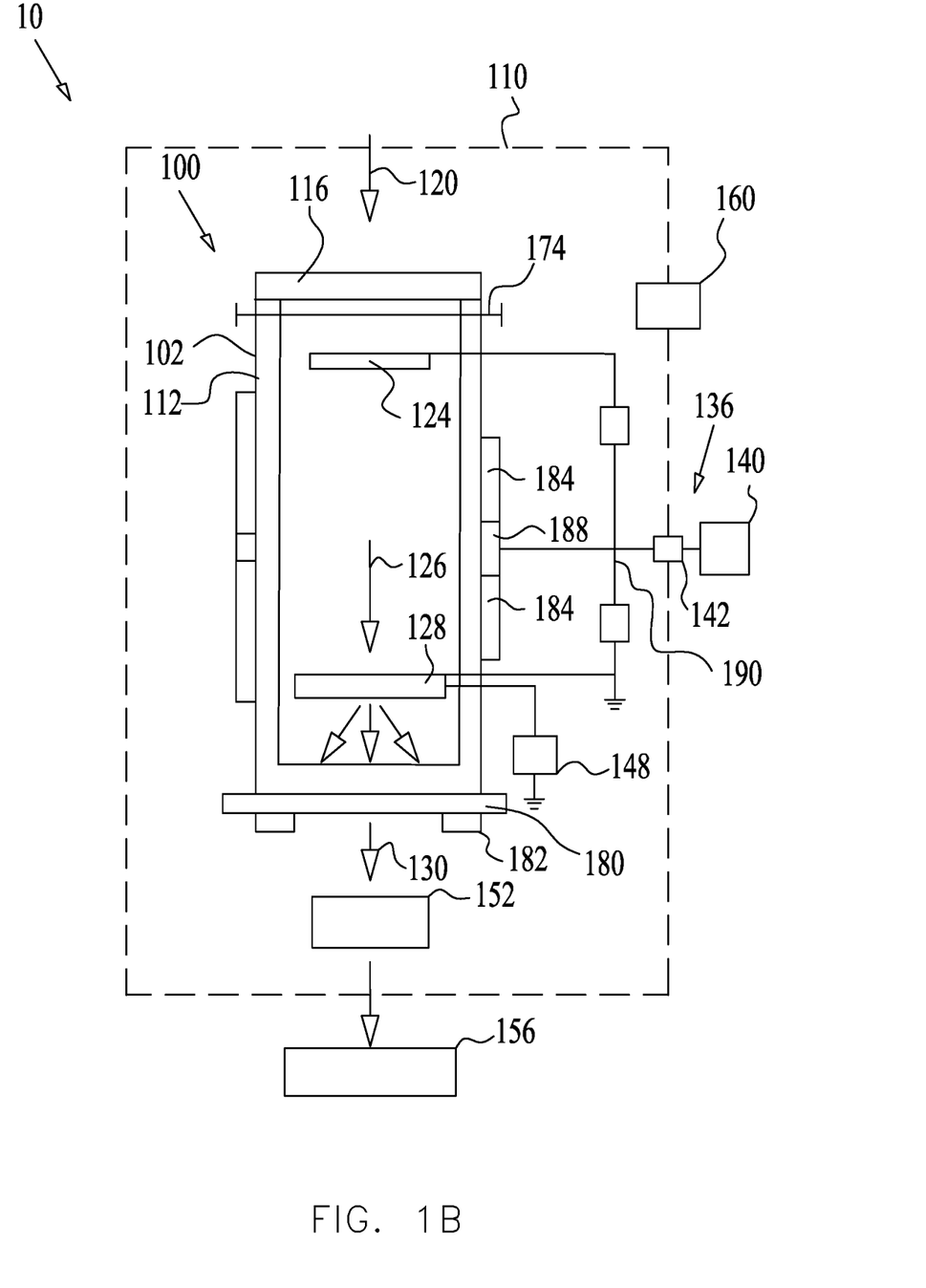

It is noted that in FIGS. 1A and 1B the photocathode 124 is shown placed at a distance from the cover portion 116 while is some embodiments the photocathode 124 may be placed in close proximity to the cover portion 116 to allow the photocathode 124 to receive the photons 120.

FIG. 1B is a non-limiting exemplary realization of the light sensor assembly 100. The electrical biasing subassembly 136 may comprise a printed circuit board (PCB) 180 and electrical contacts 182 which may be provided at any suitable location such as in the vicinity of the semiconductor diode 128. The PCB 180 is configured for electrical communication and control of the semiconductor diode 128 and/or the photocathode 124, as well as for outputting the output signal 130 from the light sensor assembly 100. The cover 116 and the receptacle portion 112 may be formed of vacuum-compatible materials, such as glass. The receptacle portion 112 may be at least partially covered by further vacuum-compatible materials, such as an electrically insulating material 184, which may comprise ceramics or plastics, in a non-limiting example, shown forming rings around the housing 102.

An electrode 188 (e.g. formed of metals), or any other suitable electrically conducting material, may be placed intermediate the ceramic rings 184 or at any other suitable location. The electrode 188 may be in electrical communication with the power supply 140 via a voltage divider 190, which may be configured to provide the high voltage supply to the photocathode 124 while grounding the semiconductor diode 128.

As seen in FIG. 2, the light sensor assembly 100 may be deployed in a particle detection system 200 which may be a vacuum containing system 170, since the particle detection system 200 is positioned at least partially or completely within the vacuum chamber 110. The particle detection system 200 may comprise a scintillator 202 and a light guide 204.

In some embodiments, the scintillator 202 may be in electrical communication with the electrical biasing subassembly 136 (FIGS. 1A and 1B) via wires (not shown) or by any other suitable means. In some embodiments, the scintillator 202 may be biased and electrically controlled by a separate electrical biasing subassembly, shown schematically as block 206. Particles 210 propagate to the scintillator 202. The scintillator 202 is typically biased by the electrical biasing subassembly 136 and/or 206 with a voltage of about 5 to 12 kV in a non-limiting example, or any other voltage, relative to the light sensing assembly 100, for attracting the particles 210 thereto. The scintillator 202 is configured for converting the particles 210 impinging thereon to the photons 120. The light guide 204 guides the photons 120 to the light sensor assembly 100, thereby yielding the output signal 130.

The light sensor assembly 100 may be aligned with the light guide 204, as seen in FIG. 2. In some embodiments, the light sensor assembly 100 may be positioned at an angle relative to the light guide 204.

The particle 210 may be emitted from a particle detection-containing system 250 configured for measuring particles. Such an exemplary, but non-limiting system 250, may comprise a TOF detection system of FIG. 3 or a SEM system of FIG. 4. It is noted that wherein the particles comprise ions, a converter (e.g. converter 314 of FIG. 3) may be provided to convert the ions to electrons prior to impinging the scintillator 202.

In accordance with an embodiment of the present disclosure the particle 210 or any other particle disclosed herein, may comprise a neutral particle or a charged particle. Non-limiting examples of charged particles may be positive or negative ions, secondary ions (SI) and electrons, secondary electrons (SE), backscattered ions (BSI) and backscattered electrons (BSE), tertiary ions (SI3) and tertiary electrons (SE3), sputtered positive or negative ions, molecules, protons, positrons, etc. Non-limiting examples of neutral particles may be neutral ions, sputtered neutral ions, photons etc.

Figure 3:
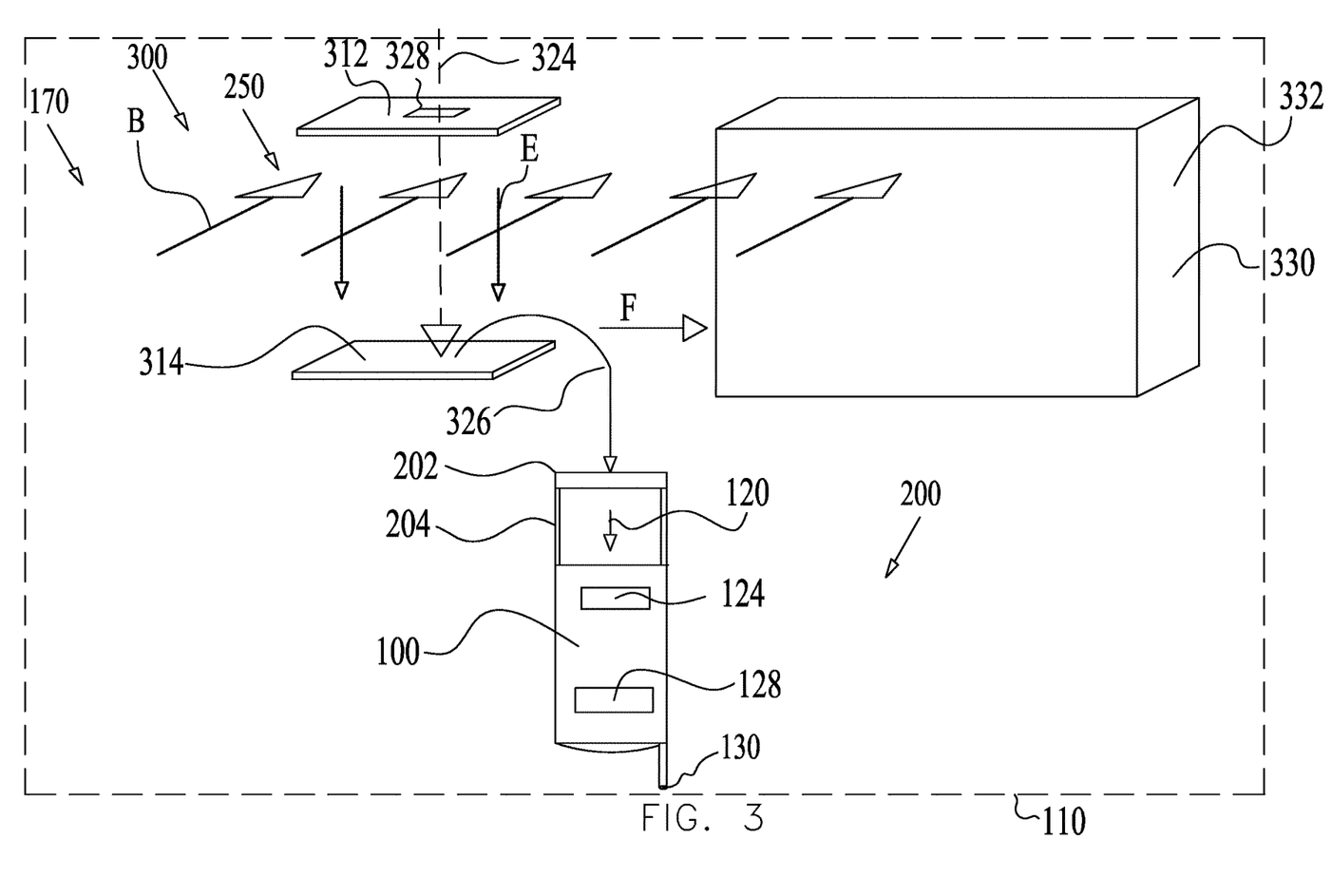
FIG. 3 is a simplified illustration of a particle detection system, constructed and operative according to an embodiment of the present disclosure.

As seen in FIG. 3, the particle detection-containing system 250 may comprise a time of flight (TOF) detection system which comprises vacuum containing system 170. In a non-limiting example, such a system 250 may comprise a magnetic time of flight (MTOF) detector system 300, which is a TOF detection system including a magnet.

The MTOF detector system 300 may include an upper panel 312 and a lower panel 314. The upper panel 312 may comprise a front plate and the lower panel 314 may comprise a converter, such as a converter plate configured for converting ions 324, (in a non-limiting example, positive ions) impinging thereon, to secondary electrons 326. The front plate 318 may comprise a grid, mesh, a slit or any other type of aperture 328 of any appropriate size to allow the ion 324 therethrough to the converter plate 314. The front plate 312 and the converter plate 314 are generally positioned parallel to each other. The front plate 312 and the converter plate 314 are electrically biased for creating an electric field E therebetween.

A magnetic system 330 comprising a single or plurality of permanent magnets or electromagnets is configured to generate a magnetic field, B, such as a homogeneous or non-homogeneous magnetic field, between the front plate 312 and converter plate 314. The magnetic system 330 comprises two oppositely facing permanent magnets, or coils, it being appreciated that any suitable means for generating a magnetic field may be provided. In some embodiments, the magnetic system 330 may comprise one or more magnets 332 accompanied by pole pieces (not shown) configured to generate magnetic field B.

It is noted that in FIG. 3 the magnetic system 330 is shown offset the front plate 312, converter plate 314 and the light sensor assembly 100. In some embodiments, the magnetic system 330 may be structured to surround (at least partially) the front plate 312, converter plate 314 and the light sensor assembly 100. In some embodiments, the magnetic system 330 may be structured to surround only part of the (MTOF) detector system 300 components.

The magnetic field, B, and the electric field E are positioned normally (namely orthogonally) to each other, thereby creating a crossed EXB field for propelling the secondary electrons 326 away from the converter 314 towards the scintillator 202 of the particle detection system 200 of FIG. 2.

The orientation of the force produced by the crossed EXB field depends on the orientation of the electric field E and the magnetic field, B, as well as the charge (positive or negative) of the particle. In the example of FIG. 3 the crossed EXB field produces a force F. The secondary electron 326 is propelled by this force F to the positively biased scintillator 202.

The trajectory of the secondary electron 326 from the converter plate 314 to the scintillator 202 is subjected to the force F and an electric field generated by the positively biased scintillator 202. As described in reference to FIG. 2, the scintillator 202 is configured for converting a particle 210, here comprising the secondary electron 326, impinging thereon to the photons 120. The light guide 204 guides the photons 120 to the light sensor assembly 100, thereby yielding the output signal 130.

In some embodiments, the MTOF detector system 300 may be entirely positioned within the vacuum chamber 110, as seen in FIG. 3. In some embodiments, the light sensor assembly 100 may be positioned in the vacuum chamber 110 while other components of the MTOF detector system 300 may be positioned within the vacuum chamber 110 or may be positioned externally to the vacuum chamber 110.

In some embodiments, the MTOF detector system 300 may comprise, for example, the MTOF detector described in U.S. Pat. No. 7,180,060 or components thereof, incorporated in its entirety herein or any other suitable ion detection system.

Figure 4:
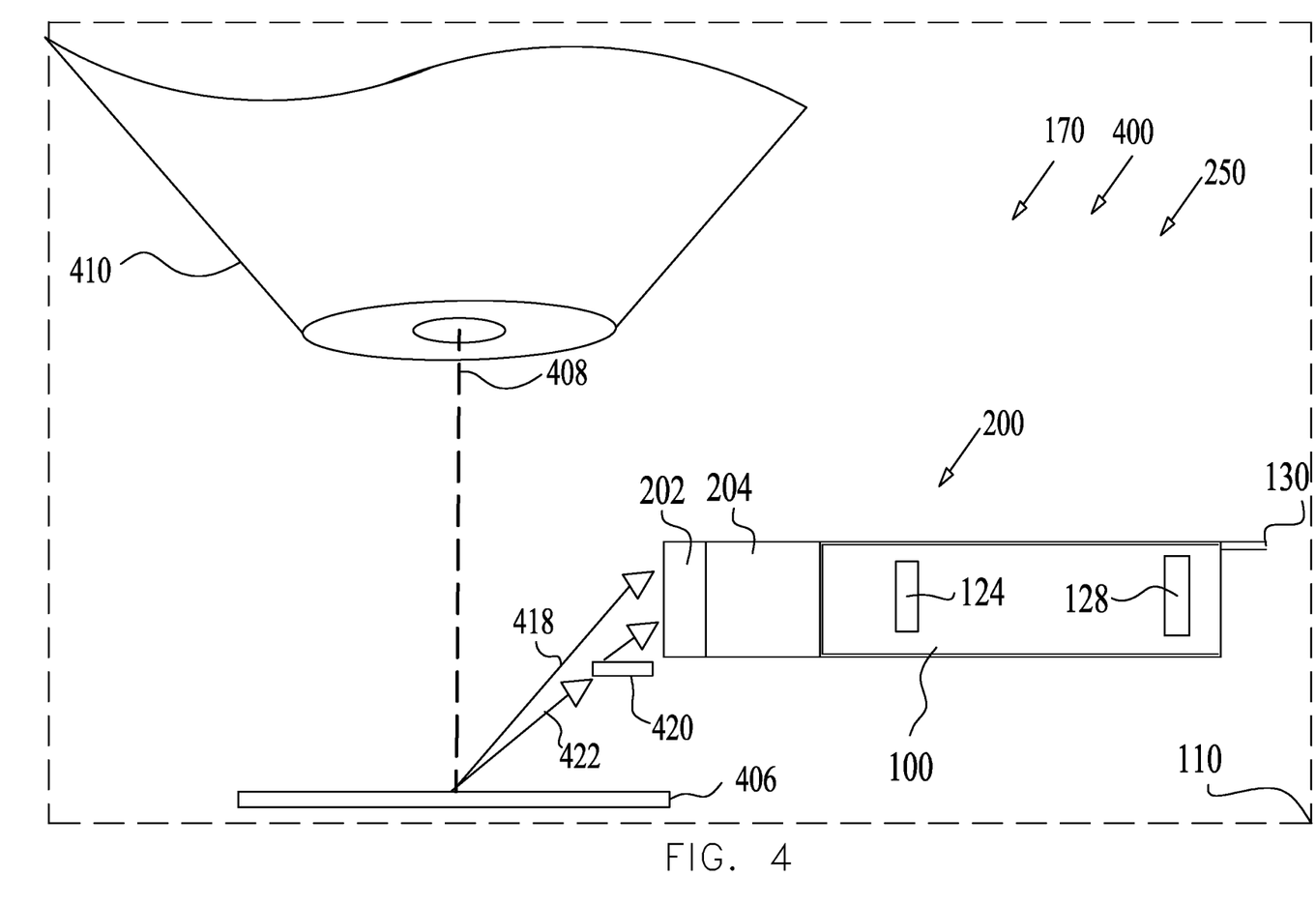
FIG. 4 is a simplified illustration of a particle detection system, constructed and operative according to an embodiment of the present disclosure.

As seen in FIG. 4, the particle detection-containing system 250 may comprise a microscopy system, such as a scanning electron microscope SEM system 400 or the like. The SEM system 400 comprises a particle beam 408 generated by a particle beam column 410. The particle beam 408 irradiates a specimen 406 causing the particle 210, such as an electron 418, to emit from the specimen 406. The SEM system 400 may comprise an optional conversion system, such as a conversion plate 420 for converting a particle, such as an ion 422 to an electron. The emitted particle propagates towards the particle detection system 200 of FIG. 2.

It is appreciated that the SEM system 400 is described as an example. The light sensor assembly 100 may be deployed in any suitable charged particle detection system comprising a charged particle beam 408 (namely the primary particle beam). Particle beam column 410 may comprise an electron beam column, a focused ion beam (FIB) column, a dual beam column, a helium beam column or any other suitable particle beam column and/or a TEM (Transmission Electron Microscope).

In some embodiments, the charged particle detection system, (e.g. the SEM system 400) may be entirely positioned within the vacuum chamber 110, as seen in FIG. 4.

In some embodiments, the light sensor assembly 100 may be positioned in the vacuum chamber 110 while other components of the charged particle detection system may be positioned within the vacuum chamber 110 or may be positioned externally to the vacuum chamber 110.

In some embodiments, the light sensor assembly 100 may be utilized in detecting photons in a vacuum, such as in systems comprising plasma elements.

While various inventive embodiments have been described and illustrated herein, those of ordinary skill in the art will readily envision a variety of other means, materials, or structure for performing the function, obtaining the results, or one or more of the advantages described herein, and each of such variations or modifications is deemed to be within the scope of the inventive embodiments described herein. More generally, those skilled in the art will readily appreciate that all parameters, dimensions, materials, and configurations described herein are meant to be for example only and that the actual parameters, dimensions, materials, and configurations will depend upon the specific application or applications for which the inventive teachings is/are used. Those skilled in the art will recognize or be able to ascertain using no more than routine experimentation, many equivalents to the specific inventive embodiments described herein. It is, therefore, to be understood that the foregoing embodiments are presented by way of example only and that, within the scope of the appended claims, equivalents thereto, and any claims supported by the present disclosure, inventive embodiments may be practiced otherwise than as specifically described and claimed. Inventive embodiments of the present disclosure are directed to each individual feature, system, article, material, composition, kit, method, and step, described herein. In addition, any combination of two or more such features, systems, articles, materials, compositions, kits, methods, and steps, if such features, systems, articles, materials, compositions, kits, methods, and steps, are not mutually inconsistent, is included within the inventive scope of the present disclosure.

Embodiments disclosed herein may also be combined with one or more features, functionality, or materials, as well as complete systems, devices or methods, to yield yet other embodiments and inventions. Moreover, some embodiments, may be distinguishable from the prior art by specifically lacking one and/or another feature disclosed in the particular prior art reference(s); i.e., claims to some embodiments may be distinguishable from the prior art by including one or more negative limitations.

Also, as noted, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Any and all references to publications or other documents, including but not limited to, patents, patent applications, articles, webpages, books, etc., presented anywhere in the present application, are herein incorporated by reference in their entirety. Moreover, all definitions, as defined and used herein, should be understood to control over dictionary definitions, definitions in documents incorporated by reference, and ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An in-vacuum light sensor system, comprising:
    a light sensor assembly including:
        a photocathode configured for converting an impinging photon to a photoelectron;
        a semiconductor diode configured for multiplying the photoelectron impinging thereon; and
        a housing comprising vacuum-compatible materials configured for being placed in a vacuum chamber,
        said housing configured for housing the photocathode and the semiconductor diode and for propagation of the photoelectron from the photocathode to the semiconductor diode;
    an electrical biasing subassembly configured for electrically biasing at least the photocathode and the semiconductor diode; and
    the vacuum chamber configured for positioning the light sensor apparatus therein.

2. The in-vacuum light sensor system according to claim 1, wherein the housing consists of the vacuum-compatible materials.

3. The in-vacuum light sensor system according to claim 1, wherein the housing comprises a tube and a cover, which are formed of the vacuum-compatible materials.

4. The in-vacuum light sensor system according to claim 1, wherein the vacuum chamber is provided with a vacuum feedthrough for electrical communication of the light sensor assembly with components exterior to the vacuum chamber.

5. The in-vacuum light sensor system according to claim 1, wherein the housing is configured with a small diameter of less than two centimeters allowing the light sensor assembly to be positioned within a crowded vacuum chamber.

6. The in-vacuum light sensor system according to claim 1, wherein the photocathode is in electrical communication with a high voltage supply and the semiconductor diode is in electrical communication with a low voltage supply.

7. The in-vacuum light sensor system according to claim 1, wherein the housing is at least partially covered by an electrically insulating material and by an electrically conducting material.

8. The in-vacuum light sensor system according to claim 1, wherein the light sensor system is provided in a particle detection system, the particle detection system further comprising:
    an optional conversion system for converting a particle to an electron;
    a scintillator configured for converting the electrons impinging thereon to photons; and
    a light guide for guiding the photons exiting the scintillator to the light sensor assembly.

9. The in-vacuum light sensor system according to claim 8, wherein the scintillator and the light guide are placed within the vacuum chamber.

10. The in-vacuum light sensor system according to claim 8, wherein the particle is an ion and the particle detection system is deployed within a time of flight (TOF) system.

11. The in-vacuum light sensor system according to claim 10, wherein the TOF system comprises a magnetic time of flight (MTOF) detector system, which further comprises:
    an electrically biased front plate and converter plate for generating an electrical field E; and
    a magnetic assembly for generating a magnetic field B, thereby producing an EXB field.

12. The in-vacuum light sensor system according to claim 11, wherein the magnetic assembly is positioned within the vacuum chamber.

13. The in-vacuum light sensor system according to claim 8, wherein the particle detection system is deployed within a scanning electron microscope (SEM) system, the SEM system comprising:
    a particle beam generated by a particle beam column;
    the particle beam column configured to irradiate a specimen causing a particle to emit from the specimen and wherein the particle propagates to the scintillator.

14. The in-vacuum light sensor system according to claim 13, wherein the particle beam column is positioned within the vacuum chamber.

15. A light sensor assembly comprising:
    a photocathode configured for converting an impinging photon to a photoelectron;
    a semiconductor diode configured for multiplying the photoelectron impinging thereon; and
    a housing comprising vacuum-compatible materials configured for being placed in a vacuum chamber,
    said housing configured for housing the photocathode and the semiconductor diode and for propagation of the photoelectron from the photocathode to the semiconductor diode.

16. The light sensor assembly according to claim 15, wherein an output signal is generated from the photoelectron multiplied by the semiconductor diode, wherein the output signal is provided in a time response of one nanosecond or less.

17. A method for generating an output signal indicative of a light signal in a vacuum chamber comprising:
    converting a photon impinging on a photocathode to a photoelectron;
    accelerating the photoelectron within a housing to a semiconductor diode configured for multiplying the photoelectron impinging thereon, positioning the housing within a vacuum chamber, the housing comprising vacuum-compatible materials and being configured for housing the photocathode and the semiconductor diode; and generating an output signal from the multiplied photoelectron.

18. The method according to claim 17, further comprising electrically biasing at least the photocathode and the semiconductor diode so as to accelerate the photoelectron from the photocathode to the semiconductor diode.

19. The method according to claim 18, wherein the output signal is provided in a time response of one nanosecond or less.

20. An in-vacuum light sensor system, comprising:
a light sensor assembly including:
   a photocathode configured for converting an impinging photon to a photoelectron;
   a semiconductor diode configured for multiplying the photoelectron impinging thereon; and
   a housing comprising vacuum-compatible materials configured for being placed in a vacuum chamber,
   said housing configured for housing the photocathode and the semiconductor diode and for propagation of the photoelectron from the photocathode to the semiconductor diode;
an electrical biasing subassembly configured for electrically biasing at least the photocathode and the semiconductor diode; and
the vacuum chamber configured for positioning the light sensor apparatus therein,
wherein the particle is an ion and the particle detection system is deployed within a time of flight (TOF) system.

\* \* \* \* \*